(12) United States Patent
Yamauchi et al.

(10) Patent No.: US 8,595,927 B2
(45) Date of Patent: Dec. 3, 2013

(54) METHOD FOR MANUFACTURING MULTILAYER PRINTED WIRING BOARD

(75) Inventors: Tsutomu Yamauchi, Ogaki (JP); Satoru Kawai, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 47 days.

(21) Appl. No.: 13/408,597

(22) Filed: Feb. 29, 2012

(65) Prior Publication Data
US 2012/0304458 A1    Dec. 6, 2012

Related U.S. Application Data

(60) Provisional application No. 61/453,702, filed on Mar. 17, 2011.

(51) Int. Cl.
*H05K 3/10* (2006.01)
(52) U.S. Cl.
USPC ............... 29/852; 29/825; 29/830; 29/832; 29/840
(58) Field of Classification Search
USPC ............. 29/825, 830, 832, 840, 852
See application file for complete search history.

(56) References Cited

U.S. PATENT DOCUMENTS

| | | | | |
|---|---|---|---|---|
| 5,073,814 A | * | 12/1991 | Cole et al. | 257/643 |
| 5,434,751 A | * | 7/1995 | Cole et al. | 361/792 |
| 6,909,054 B2 | * | 6/2005 | Sakamoto et al. | 174/260 |
| 7,495,332 B2 | * | 2/2009 | Kariya et al. | 257/702 |
| 2003/0150644 A1 | * | 8/2003 | Takada et al. | 174/262 |
| 2008/0196934 A1 | * | 8/2008 | Chen et al. | 174/262 |
| 2009/0107708 A1 | * | 4/2009 | Takahashi et al. | 174/257 |
| 2009/0145635 A1 | * | 6/2009 | Shimizu | 174/255 |
| 2010/0307807 A1 | | 12/2010 | Noda et al. | |
| 2010/0307809 A1 | | 12/2010 | Noda et al. | |

FOREIGN PATENT DOCUMENTS

JP     2006-041463     2/2006

OTHER PUBLICATIONS

U.S. Appl. No. 13/325,105, filed Dec. 14, 2011, Yamauchi, et al.

* cited by examiner

*Primary Examiner* — Carl Arbes
(74) *Attorney, Agent, or Firm* — Oblon, Spivak, McClelland, Maier & Neustadt, L.L.P.

(57) ABSTRACT

A method for manufacturing a printed wiring board includes preparing a core substrate having first and second surfaces, forming a penetrating hole from the first surface toward the second surface of the substrate, forming first conductor on the first surface of the substrate, forming second conductor on the second surface of the substrate, and filling conductive material in the hole such that through-hole conductor connecting the first and second conductors is formed. The forming of the hole includes forming a first opening portion on the first-surface side of the substrate, a second opening portion from the bottom of the first portion toward the second surface, and a third opening portion from the bottom of the second portion toward the second surface, and the forming of the hole satisfies X2<X3≤X1 where X1, X2 and X3 represent the diameters of the first, second and third portions.

15 Claims, 11 Drawing Sheets

(A)

(B)

(C)

(B)

(A)

(B)

US 8,595,927 B2

METHOD FOR MANUFACTURING MULTILAYER PRINTED WIRING BOARD

CROSS-REFERENCE TO RELATED APPLICATIONS

The present application is based upon and claims the benefit of priority to U.S. Application No. 61/453,702, filed Mar. 17, 2011, the entire contents of which are incorporated herein by reference.

BACKGROUND OF THE INVENTION

1. Field of the Invention

The present invention relates to a method for manufacturing a printed wiring board which includes a core substrate having a penetrating hole, a first conductive circuit and a second conductive circuit formed on the core substrate, and a through-hole conductor formed in the penetrating hole and connecting the first conductive circuit and the second conductive circuit.

2. Discussion of the Background

In Japanese Laid-Open Patent Publication No. 2006-41463, a first opening portion is formed by irradiating a laser from an upper-surface side (first-surface side) of a core substrate, and a second opening portion is also formed by irradiating a laser from a lower-surface side (second-surface side). A penetrating hole is formed with the first opening portion and the second opening portion. The first opening portion tapers toward the second surface, and the second opening portion tapers toward the first surface. Then, by filling plating in the penetrating hole, a through-hole conductor with a small diameter is formed that can connect the upper and lower surfaces of the core substrate. The contents of this publication are incorporated herein by reference in its entirety.

SUMMARY OF THE INVENTION

According to one aspect of the present invention, a method for manufacturing a printed wiring board includes preparing a core substrate having a first surface and a second surface on the opposite side of the first surface, forming a penetrating hole from the first surface of the core substrate toward the second surface, forming a first conductor on the first surface of the core substrate, forming a second conductor on the second surface of the core substrate, and filling a conductive material in the penetrating hole such that a through-hole conductor connecting the first conductor and the second conductor is formed. The forming of the penetrating hole includes forming a first opening portion on a first-surface side of the core substrate, forming a second opening portion from a bottom portion of the first opening portion toward the second surface, and forming a third opening portion from a bottom portion of the second opening portion toward the second surface, and the forming of the penetrating hole satisfies $X2 < X3 \leq X1$ where $X1$ represents a diameter of the first opening portion, $X2$ represents a diameter of the second opening portion, and $X3$ represents a diameter of the third opening portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
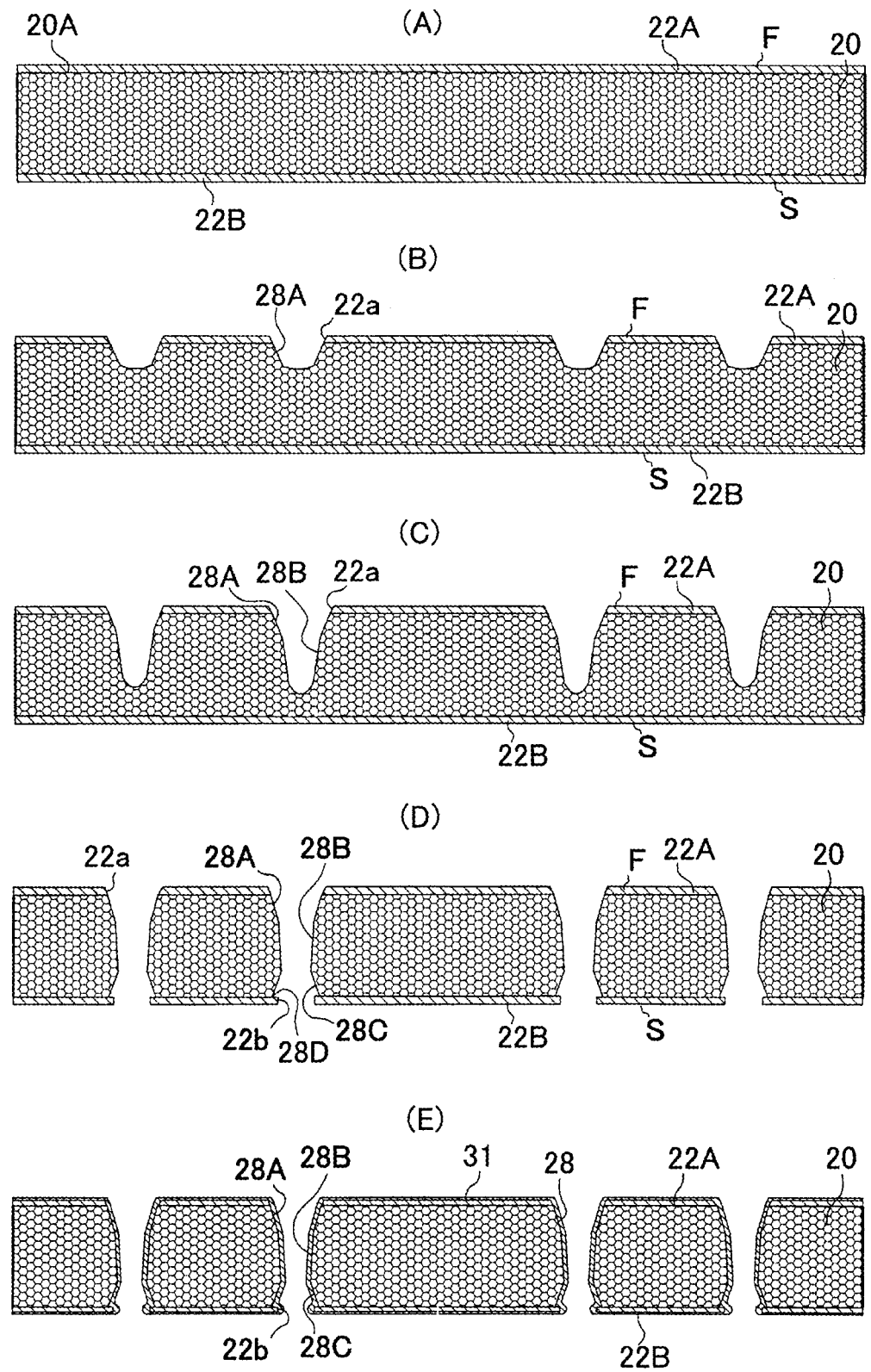
FIGS. 1(A)-1(E) are views showing steps of a method for manufacturing a multilayer printed wiring board according to an embodiment of the present invention.
Figure 2:
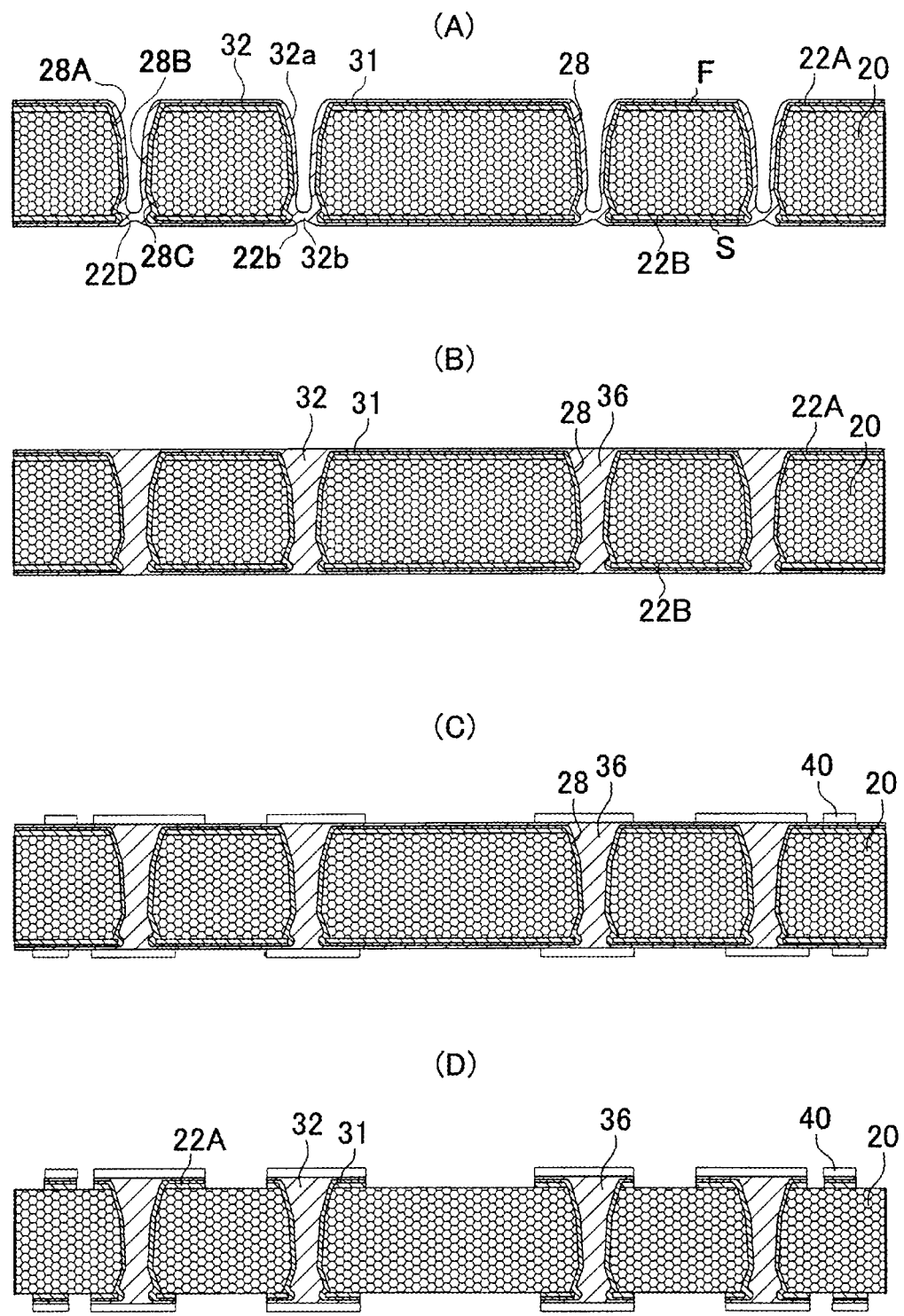
FIGS. 2(A)-2(D) are views showing steps of a method for manufacturing a multilayer printed wiring board according to the embodiment of the present invention.
Figure 3:
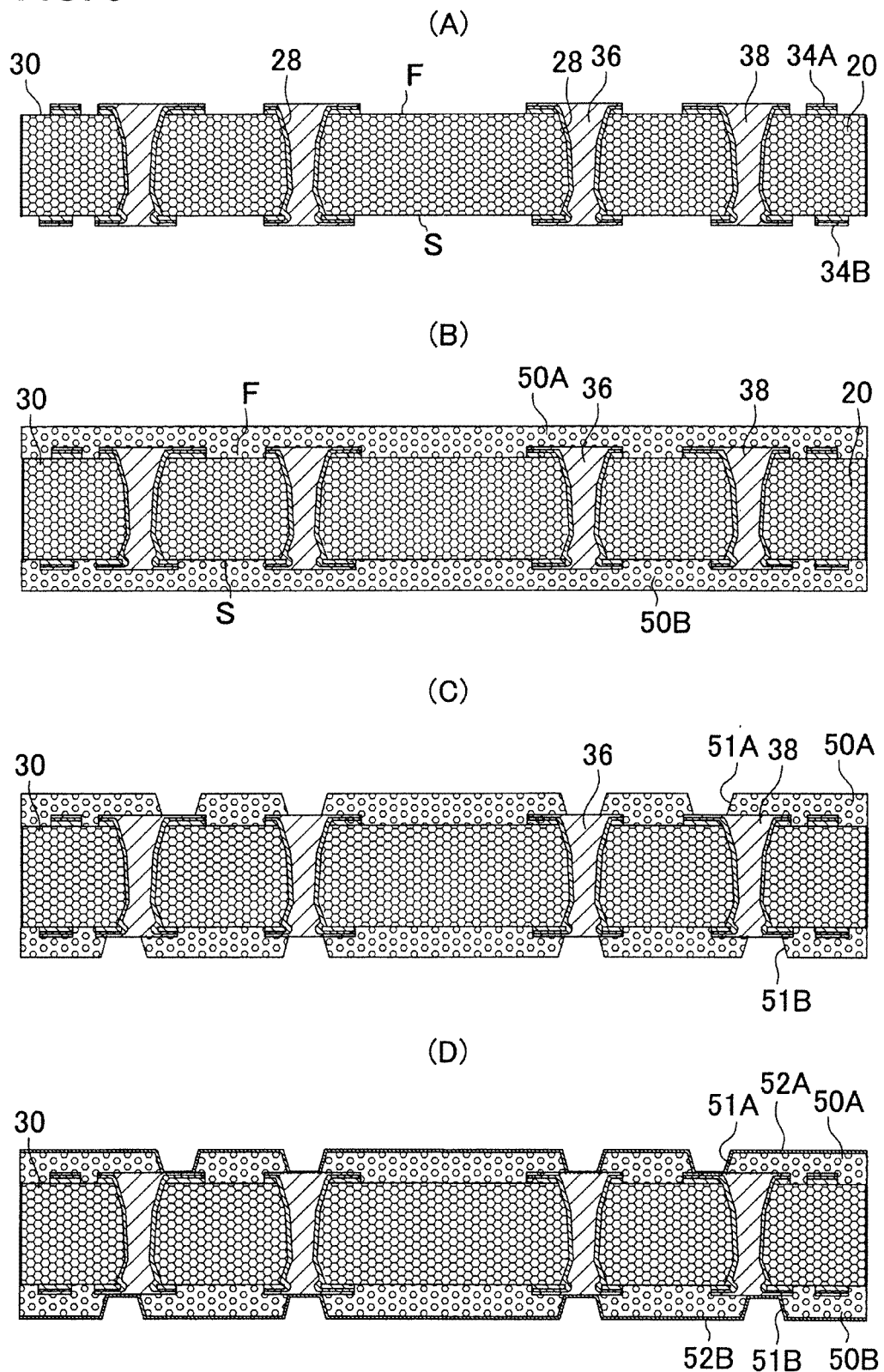
FIGS. 3(A)-3(D) are views showing steps of a method for manufacturing a multilayer printed wiring board according to the embodiment of the present invention.
Figure 4:
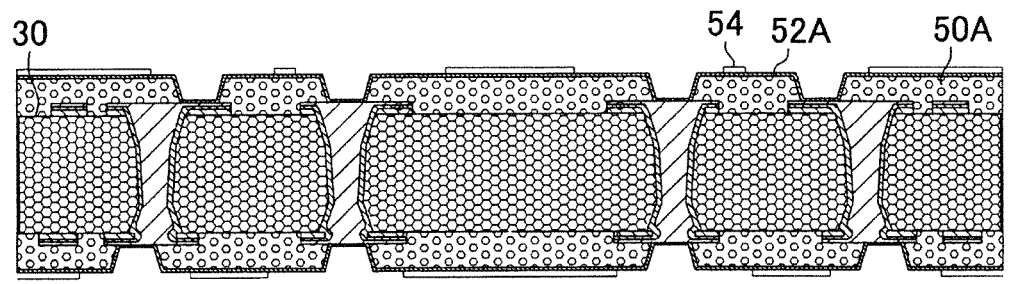
FIGS. 4(A)-4(C) are views showing steps of a method for manufacturing a multilayer printed wiring board according to the embodiment of the present invention.
Figure 4:
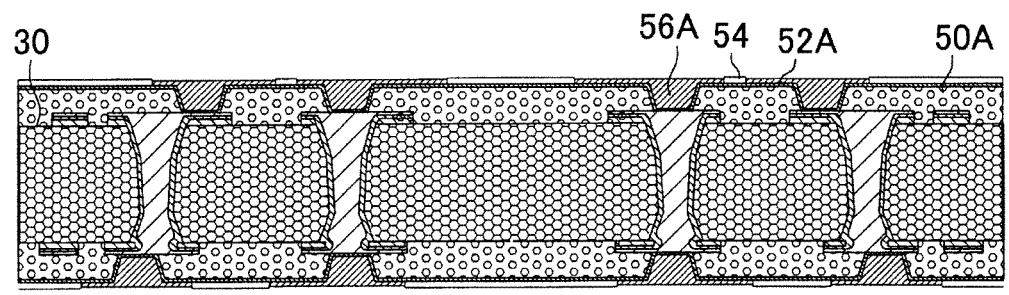
Figure 4:
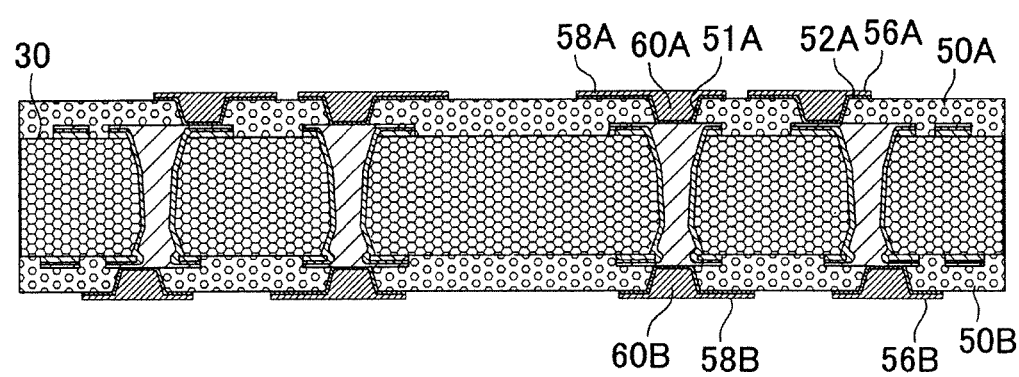
Figure 5:
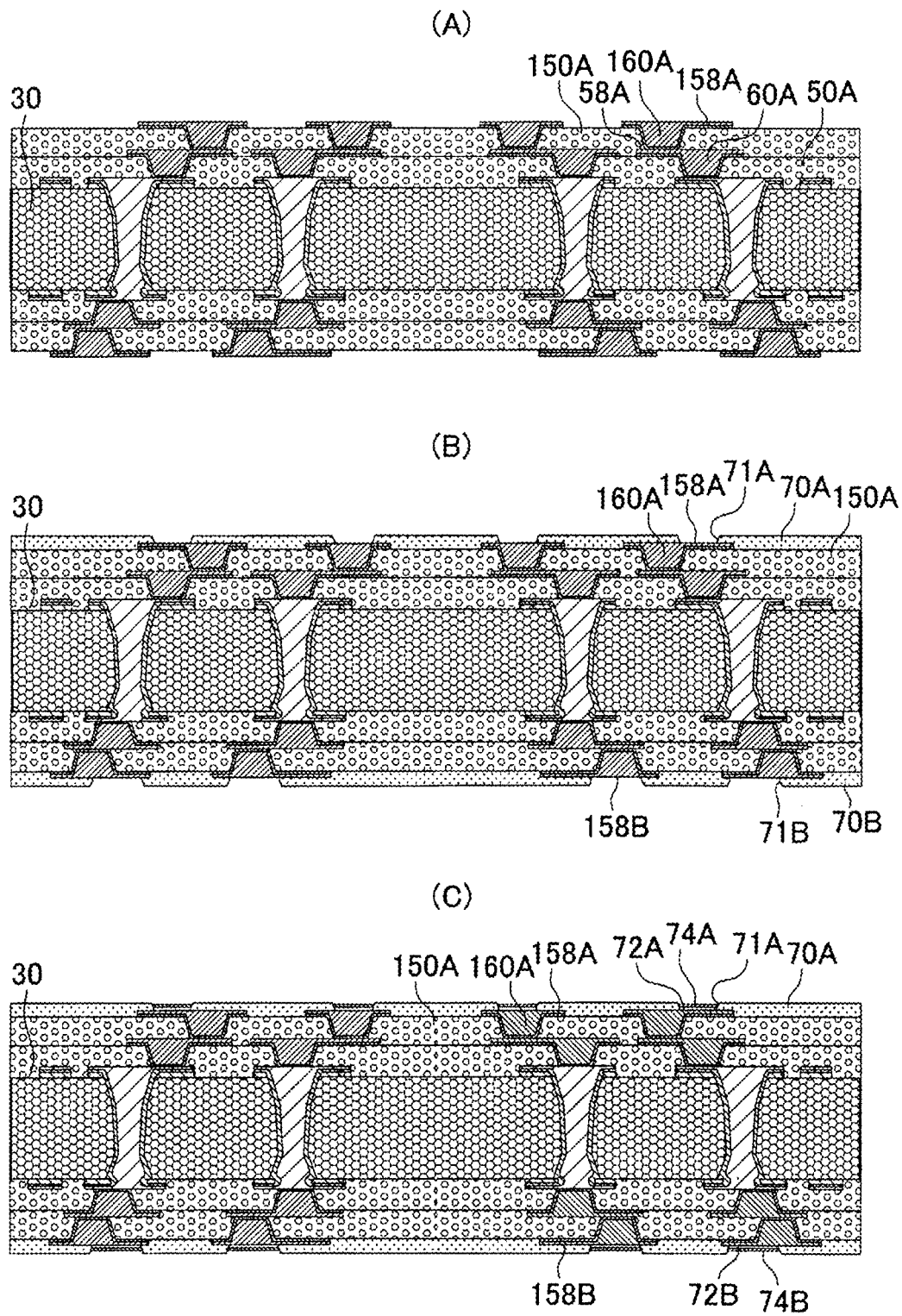
FIGS. 5(A)-5(C) are views showing steps of a method for manufacturing a multilayer printed wiring board according to the embodiment of the present invention.

The embodiments will now be described with reference to the accompanying drawings, wherein like reference numerals designate corresponding or identical elements throughout the various drawings.

Figure 6:
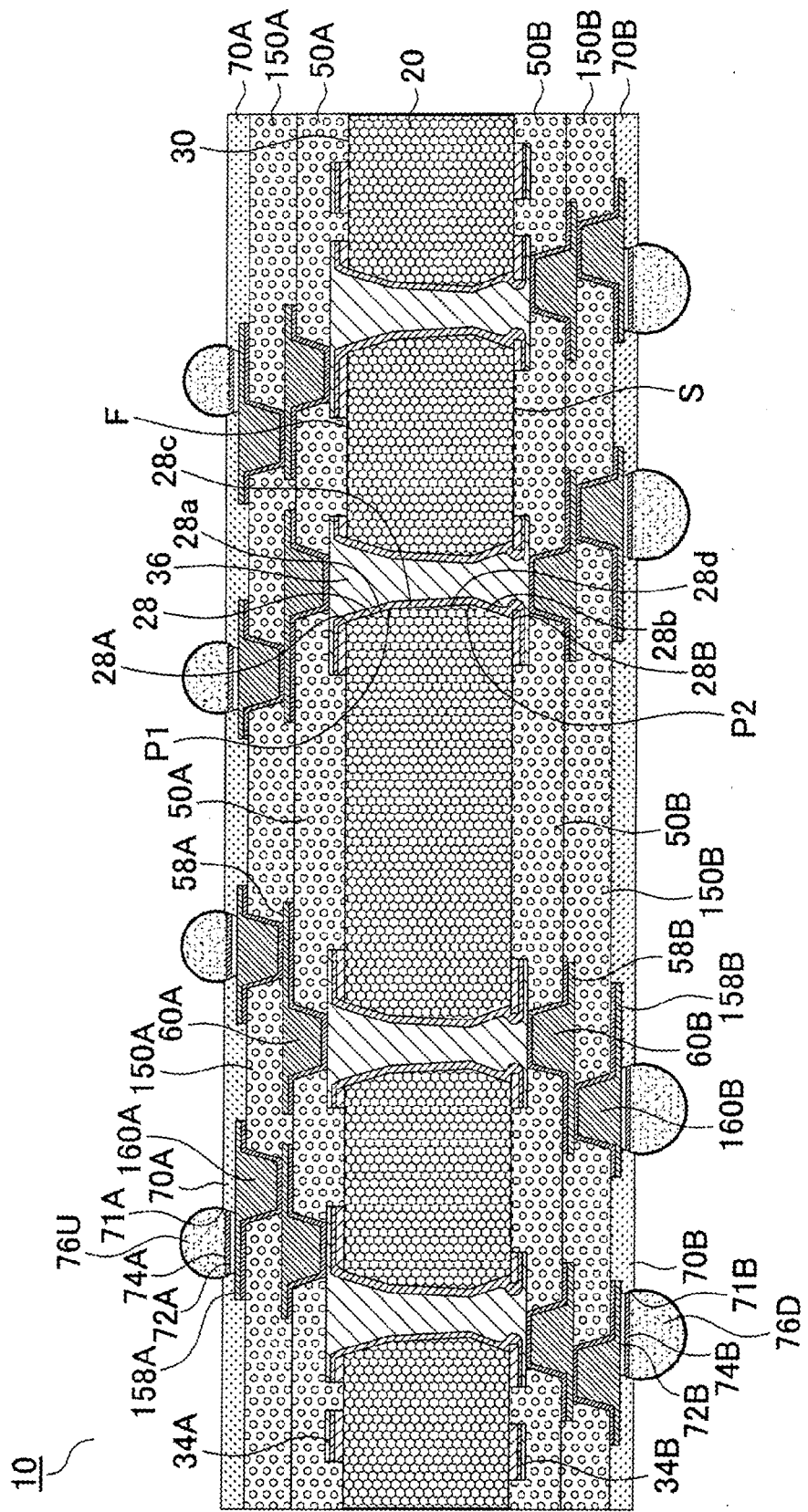
FIG. 6 is a cross-sectional view of a multilayer printed wiring board prior to mounting an IC chip.

A multilayer printed wiring board manufactured using a manufacturing method according to an embodiment of the present invention is described with reference to a cross-sectional view in FIG. 6. FIG. 6 shows multilayer printed wiring board 10 prior to mounting an IC chip.

In multilayer printed wiring board 10 according to the present embodiment, first conductor (34A) is formed on first surface (F) of core substrate 30, and second conductor (34B) is formed on second surface (S). First conductor (34A) and second conductor (34B) are electrically connected by through-hole conductor 36.

Conductor (34A) is made up of copper foil (22A) formed on first surface (F) of core substrate 30, electroless plated film 31 on copper foil (22A) and electrolytic plated film 32 on electroless plated film 31. Conductor (34B) is made up of copper foil (22B) formed on second surface (S) of core substrate 30, electroless plated film 31 on copper foil (22B) and electrolytic plated film 32 on electroless plated film 31.

Interlayer resin insulation layer (50A) is formed on first surface (F) of core substrate 30 and on first conductor (34A). Third conductor (58A) is formed on interlayer resin insulation layer (50A). Third conductor (58A) and first conductor (34A) are connected by via conductor (60A) that penetrates through interlayer resin insulation layer (50A). Interlayer resin insulation layer (150A) is formed on interlayer resin insulation layer (50A) and on third conductor (58A). Fourth conductor (158A) is formed on interlayer resin insulation layer (150A). Fourth conductor (158A) and third conductor (58A) are connected by via conductor (160A) that penetrates through interlayer resin insulation layer (150A).

On the other hand, interlayer resin insulation layer (50B) is formed on second surface (S) of core substrate 30 and on second conductor (34B). Third conductor (58B) is formed on interlayer resin insulation layer (50B). Third conductor (58B) and first conductor (34A) are connected by via conductor (60B) that penetrates through interlayer resin insulation layer (50B). Interlayer resin insulation layer (150B) is formed on interlayer resin insulation layer (50B) and on third conductor (58B). Fourth conductor (158B) is formed on interlayer resin insulation layer (150B). Fourth conductor (158B) and third conductor (58B) are connected by via conductor (160B) that penetrates through interlayer resin insulation layer (150B).

Solder-resist layer (70A) is formed on interlayer resin insulation layer (150A), and solder-resist layer (70B) is formed on interlayer resin insulation layer (150B). Solder-resist layers (70A, 70B) have openings (71A, 71B) which expose at least part of fourth conductors (158A, 158B) respectively. Solder bumps (76U, 76D) are formed respectively in openings (71A, 71B).

Next, through-hole conductor 36 in FIG. 6 is described. Core substrate 30 is an insulative substrate having first surface (F) and second surface (S) opposite first surface (F). Core substrate 30 has penetrating hole 28. Through-hole conductor 36 is made of plated metal filled in penetrating hole 28.

Figure 7:
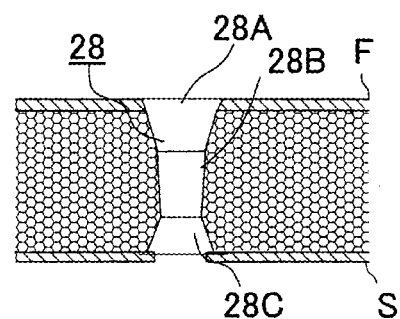
FIG. 7(A) is a cross-sectional view of a core substrate with a penetrating hole.
FIG. 7(B) is a cross-sectional view of the penetrating hole.
Figure 7:
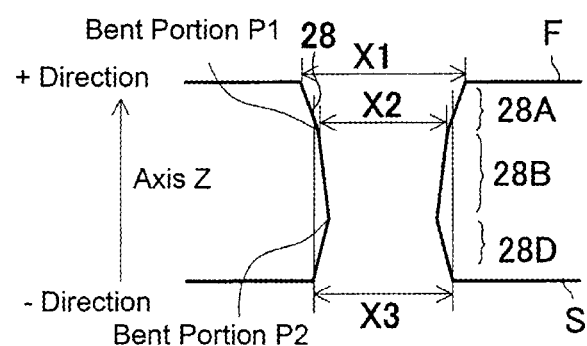

A magnified view of penetrating hole 28 is shown in FIG. 7(A). Penetrating hole 28 is made up of first opening portion (28A) formed on the first-surface (F) side of core substrate 30, second opening portion (28B) formed from the bottom of first opening portion (28A) toward second surface (S), and third opening portion (28C) formed on the second-surface (S) side of core substrate 30.

Figure 11:
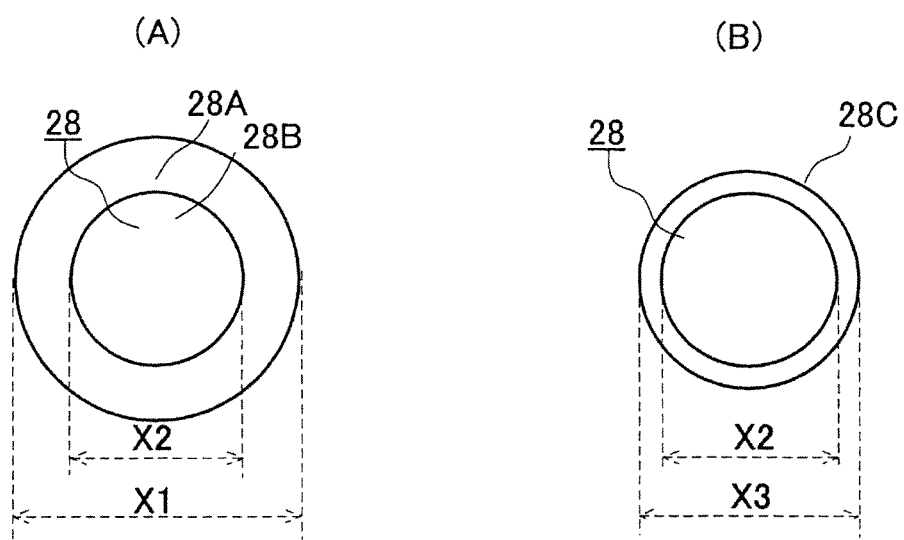
FIGS. 11(A)-11(B) are plan views showing opening portions according to an embodiment of the present invention.

First opening portion (28A), second opening portion (28B) and third opening portion (28C) are formed by irradiating a laser from the first-surface (F) side of core substrate 30. As shown in FIG. 7(B) and FIG. 11, maximum diameter (X2) of second opening portion (28B) is smaller than maximum diameter (X1) of first opening portion (28A). Maximum diameter (X2) of second opening portion (28B) is smaller than diameter (X3) of third opening portion (28C). Maximum diameter (X3) of third opening portion (28C) is smaller than maximum diameter (X1) of the first opening portion. Diameters of first opening portion (28A) and second opening portion (28B) decrease from first surface (F) of core substrate 30 toward second surface (S). The diameter of third opening portion (28C) increases from first surface (F) toward second surface (S). Here, diameters (X1~X3) of opening portions (28A~28C) are each the inner diameter of their respective opening portions, and indicate the maximum value among the distances between inner walls facing each other at any selected point in each opening portion.

When the ratio at which the inner diameter of the first opening portion decreases in a direction from the first surface of the core substrate to the second surface is set as ΔW1, and the ratio at which the inner diameter of the second opening portion decreases in a direction from the first surface of the core substrate to the second surface is set as ΔW2, ΔW1>ΔW2 is satisfied. Accordingly, penetrating hole 28 bends at the connected area of first opening portion (28A) and second opening portion (28B) to form bent portion (P1). Also, penetrating hole 28 bends at the connected area of second opening portion (28B) and third opening portion (28C) to form bent portion (P2).

In the present embodiment, stress generated in through-hole conductor 36 is dispersed in at least two locations; the connected area (bent portion P1) of first opening portion (28A) and second opening portion (28B) and the connected area (bent portion P2) of second opening portion (28B) and third opening portion (28C). Therefore, cracking seldom occurs.

Figure 8:
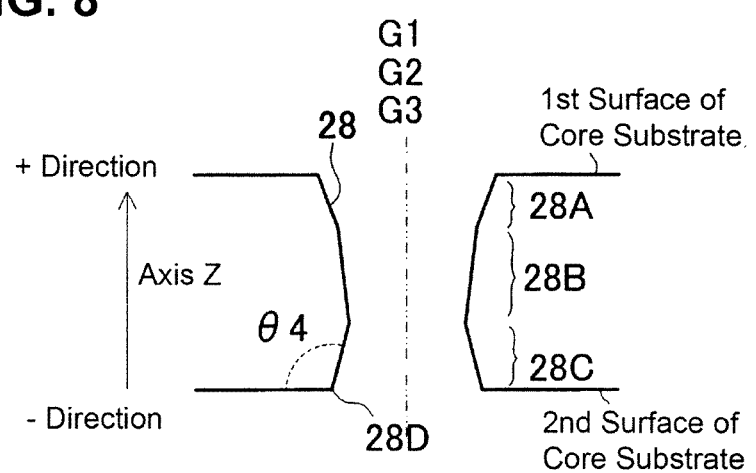
FIG. 8 is a view illustrating a penetrating hole according to an embodiment of the present invention.

Furthermore, since stress generated in a through-hole conductor is dispersed in bent portions (P1, P2), stress exerted on end portions of the through-hole conductor is also reduced. As a result, through-hole conductor 36 and via conductor 60 directly on the through-hole conductor are suppressed from peeling, enhancing their connection reliability. As shown in FIG. 8, the diameter of third opening portion (28C) increases from the first-surface (F) side toward the second-surface (S) side. Thus, angle (θ4) at the opening end of third opening portion (28C) is obtuse. As a result, thermal stress generated at the opening end of third opening portion (28C) tends to be mitigated, enhancing the reliability of the through-hole conductor. Here, "angle θ4" means the angle made by a tangent line passing through any point on the inner wall of third opening portion (28C) and a straight line parallel to the second surface of the core substrate.

Figure 9:
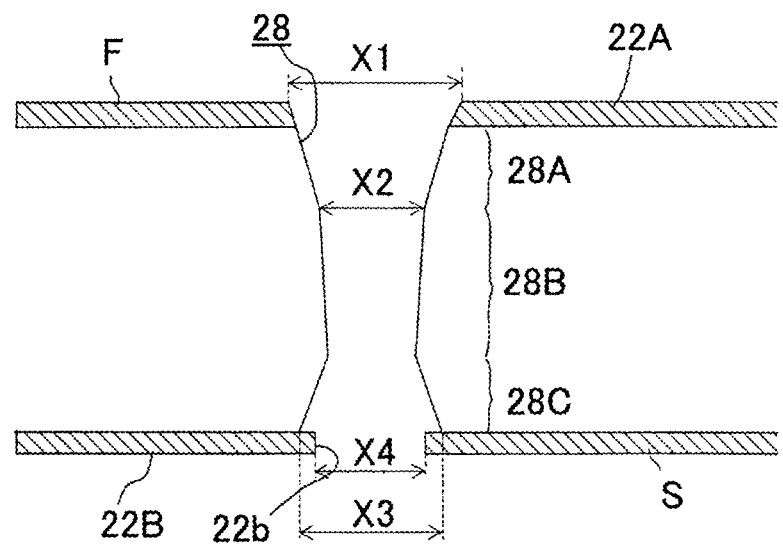
FIGS. 9(A)-9(B) are views illustrating a penetrating hole according to an embodiment of the present invention.
Figure 9:
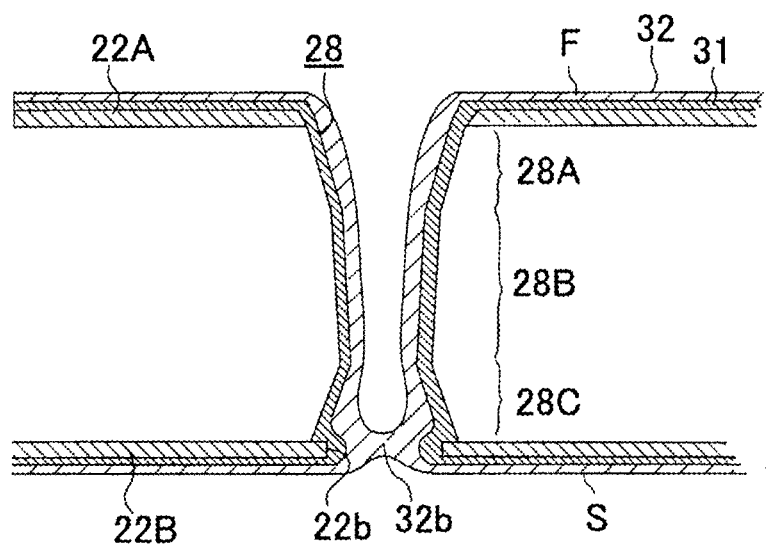

Also, as shown in FIG. 8, since first opening portion (28A), second opening portion (28B) and third opening portion (28C) are formed by a laser irradiated from the first-surface side, central axis (G1) of the first opening portion, central axis (G2) of the second opening portion and central axis (G3) of the third opening portion seldom shift from each other. As shown in FIG. 9(A), copper foil (22 B) has penetrating hole (22b). Penetrating hole (22b) is contiguous to third opening portion (28C). Diameter (X4) of penetrating hole (22b) is smaller than diameter (X2) of second opening portion (28B). Therefore, when electrolytic plating is filled in penetrating hole 28 for through-hole conductor 36, electrolytic plating is first filled in penetrating hole (22b) in copper foil (22B), thus the bottom of penetrating hole (22b) is easily covered by the electrolytic plating.

Next, a method for manufacturing multilayer printed wiring board 10 is described with reference to FIGS. 1-5.

(1) A 0.4 mm-thick core substrate 30 made of reinforcing material and resin is prepared (FIG. 1(A)). Copper foils (22A, 22B) where their respective adhesive surfaces are roughened are laminated on first surface (F) and second surface (S) of core substrate 30. As for the reinforcing material, for example, glass cloth, aramid fiber, glass fiber and the like are listed. As for the resin, epoxy resin, BT (bismaleimide triazine) resin and the like are listed. Moreover, particles made of a hydroxide are contained in the resin. As for the hydroxide, metal hydroxides such as aluminum hydroxide, magnesium hydroxide, calcium hydroxide and barium hydroxide are listed. When hydroxides are decomposed by heat, water is generated. Therefore, hydroxides are thought to rob heat of the material for forming core substrate 30. Namely, if core substrate 30 contains a hydroxide, performance in laser processing is thought to be enhanced. Next, a black-oxide treatment is conducted on surfaces of copper foils 22 using a solution containing NaOH (10 g/L), $NaClO_2$ (40 g/L) and $Na_3PO_4$ (6 g/L).

(2) By irradiating a CO2 laser from the first-surface (upper surface) side of core substrate 30, first opening portion (28A) is formed on the first-surface (F) side of core substrate 30 (FIG. 1(B)). By irradiating a CO2 laser from the first-surface (F) (upper surface) side of core substrate 30, second opening portion (28B) is formed from the bottom of first opening portion (28A) toward second surface (S) (FIG. 1(C)).

Next, by irradiating a CO2 laser from the first-surface (F) (upper surface) side of core substrate 30, third opening portion (28C) is formed from the bottom of second opening portion (28B) toward second surface (S) (FIG. 1(D)). Penetrating hole 28 is formed by connecting first opening portion (28A), second opening portion (28B) and third opening portion (28C) in core substrate 30.

At that time, the diameter of first opening portion (28A) and the inner diameter of second opening portion (28B) decrease in the minus direction along axis Z as shown in FIG. 7(B). The inner diameter of third opening portion (28C) increases in the minus direction along axis Z.

Figure 10:
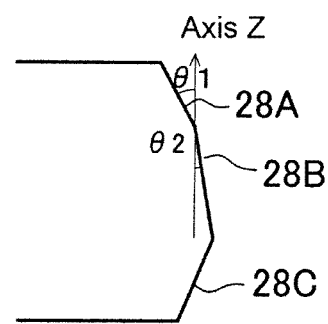
FIG. 10 is a view illustrating a penetrating hole according to an embodiment of the present invention.

As shown in FIG. 10, when the inclination of first opening portion (28A) against axis Z is set as ($\theta 1$) and the inclination of second opening portion (28B) against axis Z is set as ($\theta 2$), $\theta 1 \theta 2$ is satisfied.

The following is a detailed description of a method for forming penetrating hole 28. First opening portion (28A) is formed by irradiating one shot of a CO2 laser at a predetermined location on the first-surface (F) side of core substrate 30. Next, by irradiating a CO2 laser from the first-surface (F) (upper surface) side of core substrate 30, second opening portion (28B) is formed from the bottom of first opening portion (28A) toward second surface (S). Diameter (X2) of second opening portion (28B) is smaller than diameter (X1) of first opening portion (28A). Here, the number of laser shots for forming second opening portion (28B) is not limited specifically. If the number of shots is two or greater, their laser conditions are preferred to be the same from a productivity point of view.

Next, using a CO2 gas laser, third opening portion (28C) is formed from the bottom of second opening portion (28B). The laser conditions for forming third opening portion (28C) are preferred to be the same as those for forming second opening portion (28B). The number of laser shots for forming third opening portion (28C) is not limited specifically. If the number of shots is two or greater, their laser conditions are preferred to be the same from a productivity point of view. When forming third opening portion (28C), a laser is diffused on the inner surface of copper foil (22B). Because of the diffused laser, the resin that forms core substrate 30 is melted, increasing the diameter of the opening from first surface (F) toward second surface (S). The laser diameter (opening diameter of the aperture) for forming the second opening portion and the third opening portion is smaller than the laser diameter (opening diameter of the aperture) for forming the first opening portion. The laser pulse width for forming the second opening portion and the third opening portion is greater than the laser pulse width for forming the first opening portion.

When the laser pulse width for forming the second opening portion and the third opening portion is set as (A) and the laser pulse width for forming the first opening portion is set as (B), $1.5 \leq A/B \leq 3$ is preferred to be satisfied.

In doing so, a penetrating hole having a small diameter is formed efficiently (with a minimum number of shots). If A/B is less than 1.5, formation of an opening does not progress and the number of shots is required to increase, thus manufacturing efficiency may decrease. On the other hand, if A/B exceeds 3, heat is diffused excessively in a lateral direction, and the opening diameter becomes excessively large compared with the depth of the opening.

Next, penetrating hole (22b) is formed in copper foil (22B). Penetrating hole (22b) is contiguous to third opening portion (28C). Diameter (X4) of penetrating hole (22b) is smaller than above-described (X2) of the second opening portion (see FIG. 9(A)).

The thickness of core substrate 30 is preferred to be 0.4 mm or less. If the thickness exceeds 0.4 mm, it is difficult to form a penetrating hole by irradiating a laser from one surface.

(3) Next, core substrate 30 with penetrating hole 28 is immersed in a solution containing permanganic acid at a predetermined concentration for a desmearing treatment. At that time, the weight-loss rate of core substrate 30 is preferred to be 1.0 wt. % or less, more preferably 0.5 wt. % or less. Since the core substrate is made by impregnating reinforcing material such as glass cloth with resin, when resin is dissolved by a desmearing treatment, the glass cloth protrudes into the penetrating hole. When the weight-loss rate of the core substrate is in the above range, protrusion of glass cloth is suppressed and voids seldom remain when the penetrating hole is filled with plating.

A palladium catalyst is attached to the surfaces of core substrate 30. Then, the core substrate is immersed in an electroless plating solution to form electroless plated film 31 on first surface (F) and second surface (S) of the core substrate and on the inner wall of penetrating hole 28 (FIG. 1(E)). As the material for forming electroless plated film 31, copper, nickel and the like are listed.

Using the electroless plated film as a seed layer, electrolytic copper plating is performed so that electrolytic plated film 32 is formed on electroless plated film 31. Here, penetrating hole (22b) in copper foil (22B) on the second-surface (S) side has a smaller diameter than third opening portion (28C). Thus, when penetrating hole 28 of core substrate 30 is filled with plating, plating is first deposited to fill penetrating hole (22b) of copper foil (22B) (see FIGS. 1(E), 9(B)). As a result, the bottom of penetrating hole 28 of core substrate 30 is covered by plating. Then, the inside of penetrating hole 28 of core substrate 30 is gradually filled with plating (FIG. 2(B)). During that time, since plating is deposited in penetrating hole 28 whose bottom is covered by plated film, voids seldom remain in the central portion. As a result, the reliability of the through-hole conductor is enhanced.

(4) Etching resist 40 with a predetermined pattern is formed on electrolytic plated film 32 on substrate surfaces (FIG. 2(C)).

(5) Electrolytic plated film 31, electrolytic plated film 32 and copper foil exposed from etching resist 40 are removed (FIG. 2(D)).

(6) Etching resist 40 is removed. Accordingly, first conductor (34A) is formed on first surface (F) of core substrate 30 and second conductor (34B) is formed on second surface (S) of core substrate 30. First conductor (34A) and second conductor (34B) are connected by through-hole conductor 36 in penetrating hole 28 (see FIG. 3(A)).

(7) Resin film for interlayer resin insulation layers (brand name ABF-45SH, made by Ajinomoto) is laminated on first surface (F) and second surface (S) of core substrate 30 to form interlayer resin insulation layers (50A, 50B) respectively (see FIG. 3(B)).

(8) Next, using a CO2 gas laser, via-hole openings (51A, 51B) are respectively formed in interlayer resin insulation layers (50A, 50B) (see FIG. 3(C)). The substrate is immersed in an oxidation agent such as permanganate to perform a desmearing treatment (not shown in the drawing).

(9) A catalyst such as palladium is attached to the surfaces of interlayer resin insulation layers (50A, 50B), and the substrate is immersed in an electroless plating solution to form electroless plated films (52A, 52B) (FIG. 3(D)).

(10) Plating resist 54 is formed on electroless plated films 52 (FIG. 4(A)).

(11) Electrolytic plated films (56A, 56B) are formed on electroless plated films 52 exposed from plating resist 54 (see FIG. 4(B)).

(12) Plating resist 54 is removed using a solution containing monoethanolamine. By etching away the electroless plated film between portions of electrolytic plated film, third conductors (58A, 58B) and via conductors (60A, 60B) are formed. Then, Sn plating is performed on surfaces of third conductors (58A, 58B) to form SnCu layers. A silane coupling agent is applied on the SnCu layers (FIG. 4(C)).

(13) Next, steps in the above (7)~(12) are repeated (FIG. 5(A)). Then, solder-resist layers (70A, 70B) having openings (71A, 71B) are formed on the substrate surfaces (FIG. 5(B)). The top surfaces of third conductors (158A, 158B) exposed through openings (71A, 71B) function as solder pads. Nickel-plated layers (72A, 72B) are formed on solder pads, and gold-plated layers (74A, 74B) are further formed on nickel layers 72 (FIG. 5(C)). Other than nickel-gold layers, nickel-gold-palladium layers may also be formed.

(14) After that, by loading solder balls in openings (71A, 71B) and conducting a reflow, solder bump (76U) is formed on the first-surface (upper-surface) side and solder bump (76D) is formed on the second-surface (lower-surface) side. Accordingly, multilayer printed wiring board 10 is completed (FIG. 6).

First Example

A method for manufacturing a multilayer printed wiring board is described according to the first example of the present invention.

First, a core substrate is prepared, being made of glass cloth, epoxy resin and magnesium hydroxide. The thickness of the core substrate is approximately 0.4 mm. Copper foil is formed on the first surface and the second surface of the core substrate respectively.

By irradiating a $CO_2$ laser from the first-surface (upper-surface) side of the core substrate, a first opening portion is formed on the first-surface side of the core substrate. The number of laser shots to be irradiated here is one. The first opening portion is an opening portion that penetrates at least through the copper foil.

Next, by irradiating a $CO_2$ laser from the first-surface (upper-surface) side of the core substrate, a second opening portion is formed from the bottom of the first opening portion toward the second surface. The number of laser shots to be irradiated here is one. The laser diameter (the opening diameter of an aperture) for forming the second opening portion is smaller than the laser diameter for forming the first opening portion. The laser pulse width for forming the second opening portion is greater than the laser pulse width for forming the first opening portion. Bent portion (P1) is formed at the boundary of the first opening portion and the second opening portion.

By irradiating a $CO_2$ laser from the first-surface (upper-surface) side of the core substrate, a third opening portion is formed on the bottom of the second opening portion in the core substrate. The number of laser shots to be irradiated here is one.

The core substrate having a penetrating hole is immersed in a solution containing permanganic acid at a predetermined concentration to perform a desmearing treatment. A palladium catalyst is attached to the core substrate surfaces. Then, the core substrate is immersed in an electroless plating solution to form electroless plated film on the first and second surfaces of the core substrate and on the inner wall of the penetrating hole. Using the electroless plated film as a seed layer, electrolytic plated film is formed on the electroless plated film. The penetrating hole is filled with electrolytic plated film. An etching resist with a predetermined pattern is formed on the electrolytic plated film on the substrate surfaces.

The electroless plated film, electrolytic plated film and copper foil are removed from the portions without the etching resist.

Next, the etching resist is removed. Accordingly, a first conductor is formed on the first surface of the core substrate and a second conductor is formed on the second surface of the core substrate. The first conductor and the second conductor are connected by the through-hole conductor in the penetrating hole. Through the above procedures, the through-hole conductor in a printed wiring board is completed according to the first example.

Second Example

The method for manufacturing a printed wiring board according to the second example is a modified example of the first example.

The core substrate of the second example has a different thickness from the first example. The thickness of the core substrate in the second example is approximately 0.7 mm. When a penetrating hole is formed in the core substrate, first, a $CO_2$ laser is irradiated from the first-surface (upper-surface) side of the core substrate and a first opening portion is formed on the first-surface side of the core substrate. The number of laser shots to be irradiated here is two. The first opening portion is an opening portion that penetrates at least through the copper foil.

Next, by irradiating a $CO_2$ laser from the first-surface (upper-surface) side of the core substrate, a second opening portion is formed from the bottom of the first opening portion toward the second surface. The number of laser shots to be irradiated here is two. The laser diameter (the opening diameter of an aperture) for forming the second opening portion is smaller than the laser diameter for forming the first opening portion. The laser pulse width for forming the second opening portion is greater than the laser pulse width for forming the first opening portion. A bent portion is formed at the boundary of the first opening portion and the second opening portion.

By irradiating a $CO_2$ laser from the first-surface (upper-surface) side of the core substrate, a third opening portion is formed from the first-surface side of the core substrate. The number of laser shots to be irradiated here is one. The third opening portion is an opening portion that penetrates at least through the copper foil. Accordingly, a penetrating hole is formed in the core substrate. The substrate with the penetrating hole is immersed in a solution containing permanganic acid at a predetermined concentration to perform a desmearing treatment. A palladium catalyst is attached to the core substrate surfaces. Then, the core substrate is immersed in an electroless plating solution to form electroless plated film on the first and second surfaces of the core substrate and on the inner wall of the penetrating hole. Using the electroless plated film as a seed layer, electrolytic plated film is formed on the electroless plated film. The penetrating hole is filled with electrolytic plated film. Etching resist with a predetermined pattern is formed on the electrolytic plated film on the substrate surfaces.

The electroless plated film, electrolytic plated film and copper foil are removed from the portions without the etching resist.

Next, the etching resist is removed. Accordingly, a first conductor is formed on the first surface of the core substrate, and a second conductor is formed on the second surface of the core substrate. The first conductor and the second conductor are connected by a through-hole conductor in the penetrating hole. The through-hole conductor in a printed wiring board is completed according to the second example.

A method for manufacturing a printed wiring board according to an embodiment of the present invention includes the following: preparing a core substrate having a first surface and a second surface opposite the first surface; forming a penetrating hole from the first surface of the core substrate toward the second surface; forming a first conductor on the first surface of the core substrate; forming a second conductor on the second surface of the core substrate; and by filling conductive material in the penetrating hole, forming a through-hole conductor connecting the first conductor and the second conductor. Such a manufacturing method has the following technological features: forming a penetrating hole includes forming a first opening portion on the first-surface side of the core substrate, forming a second opening portion from the bottom of the first opening portion toward the second surface, and forming a third opening portion from the bottom of the second opening portion toward the second surface; and when the diameter of the first opening portion is set as (X1), the diameter of the second opening portion as (X2) and the diameter of the third opening portion as (X3), X2<X3≤X1 is satisfied.

In an embodiment of the present invention, a penetrating hole is formed by irradiating a laser only from one side of a core substrate (first-surface side). Accordingly, compared with situations in which a penetrating hole is formed by irradiating a laser from both sides of the core substrate (first-surface side and second-surface side), penetrating holes are formed in the core substrate at a high yield. Moreover, among the first opening portion, the second opening portion and the third opening portion that make up a penetrating hole, the first opening portion and the third opening portion positioned on outer sides each have a greater diameter than the second opening portion. Namely, in a penetrating hole formed in the core substrate, the diameter of the opening portion on each side is set relatively great. Therefore, an angle at the inner wall of a penetrating hole tends to be obtuse. Thus, if thermal stress is concentrated at an angular portion of the inner wall of the penetrating hole, the thermal stress tends to be mitigated. As a result, cracking originating in such an angular portion seldom occurs in the through-hole conductor formed in the penetrating hole, ensuring the reliability of the through-hole conductor.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
   preparing a core substrate having a first surface and a second surface on an opposite side of the first surface;
   forming a penetrating hole from the first surface of the core substrate toward the second surface;
   forming a first conductor on the first surface of the core substrate;
   forming a second conductor on the second surface of the core substrate; and
   filling a conductive material in the penetrating hole such that a through-hole conductor connecting the first conductor and the second conductor is formed,
   wherein the forming of the penetrating hole includes forming a first opening portion on a first-surface side of the core substrate, forming a second opening portion from a bottom portion of the first opening portion toward the second surface, and forming a third opening portion from a bottom portion of the second opening portion toward the second surface, and the forming of the penetrating hole satisfies X2<X3≤X1 where X1 represents a diameter of the first opening portion, X2 represents a diameter of the second opening portion, and X3 represents a diameter of the third opening portion.

2. The method for manufacturing a printed wiring board according to claim 1, wherein the forming of the first opening portion comprises decreasing the diameter of the first opening portion from the first surface of the core substrate toward the second surface, and the forming of the second opening portion comprises decreasing the diameter of the second opening portion toward the second surface.

3. The method for manufacturing a printed wiring board according to claim 1, wherein the forming of the penetrating hole comprises forming a bent portion at a connected area of the first opening portion and the second opening portion.

4. The method for manufacturing a printed wiring board according to claim 1, wherein the forming of the penetrating hole comprises forming a bent portion at a connected area of the second opening portion and the third opening portion.

5. The method for manufacturing a printed wiring board according to claim 2, wherein the forming of the penetrating hole satisfies $\Delta W1 > \Delta W2$ where $\Delta W1$ represents a ratio at which the diameter of the first opening portion decreases in a direction from the first surface of the core substrate to the second surface, and $\Delta W2$ represents a ratio at which the diameter of the second opening portion decreases in a direction from the first surface of the core substrate to the second surface.

6. The method for manufacturing a printed wiring board according to claim 1, further comprising:
   forming a first metal film on the first surface of the core substrate; and
   forming a second metal film on the second surface of the core substrate.

7. The method for manufacturing a printed wiring board according to claim 6, wherein the second metal film has a fourth opening portion which is contiguous to the third opening portion, and the fourth opening portion has a diameter which is set smaller than the diameter of the second opening portion.

8. The method for manufacturing a printed wiring board according to claim 1, wherein the forming of the first opening portion comprises forming an aperture, and the forming of the second opening portion comprises forming an aperture having an opening diameter which is set smaller than an opening diameter of the aperture for forming the first opening portion.

9. The method for manufacturing a printed wiring board according to claim 1, wherein the forming of the second opening portion comprises forming an aperture, and the forming of the third opening portion comprises forming an aperture having an opening diameter which is set same as an opening diameter of the aperture for forming the second opening portion.

10. The method for manufacturing a printed wiring board according to claim 1, wherein the forming of the first opening portion comprises irradiating laser, and the forming of the second opening portion comprises irradiating laser having a laser pulse width which is set longer than a laser pulse width of the laser for forming the first opening portion.

11. The method for manufacturing a printed wiring board according to claim 1, wherein the forming of the second opening portion comprises irradiating laser, and the forming of the third opening portion comprises irradiating laser having a laser pulse width which is set same as a laser pulse width of the laser for forming the second opening portion.

12. The method for manufacturing a printed wiring board according to claim 1, wherein the core substrate has a thickness which is set at 0.4 mm or less.

13. The method for manufacturing a printed wiring board according to claim 1, wherein the filling of the conductive material comprises plating the penetrating hole such that the penetrating hole is filled by a plating material.

14. The method for manufacturing a printed wiring board according to claim 1, wherein the filling of the conductive material comprises electrolytically plating the penetrating hole such that the penetrating hole is filled by an electrolytic plating material.

15. The method for manufacturing a printed wiring board according to claim 1, further comprising immersing the core substrate in an electroless plating solution such that an electroless plating film is formed on the first and second surfaces of the core substrate and on an inner wall of the penetrating hole.

* * * * *